United States Patent
Fuse

(10) Patent No.: US 11,004,693 B2
(45) Date of Patent: May 11, 2021

(54) LIGHT-IRRADIATION HEAT TREATMENT METHOD AND HEAT TREATMENT APPARATUS

(71) Applicant: SCREEN Holdings Co., Ltd., Kyoto (JP)

(72) Inventor: Kazuhiko Fuse, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 521 days.

(21) Appl. No.: 15/146,986

(22) Filed: May 5, 2016

(65) Prior Publication Data

US 2016/0336195 A1 Nov. 17, 2016

(30) Foreign Application Priority Data

May 13, 2015 (JP) .............................. JP2015-098139

(51) Int. Cl.
*H01L 21/324* (2006.01)
*H05B 1/02* (2006.01)
(Continued)

(52) U.S. Cl.
CPC ...... *H01L 21/324* (2013.01); *H01L 21/67115* (2013.01); *H01L 21/67248* (2013.01);
(Continued)

(58) Field of Classification Search
CPC ............. H01L 21/324; H01L 21/67115; H01L 21/67248; H01L 21/68742; H05B 1/0233; H05B 3/0047; F27B 5/14
(Continued)

(56) References Cited

U.S. PATENT DOCUMENTS 4,493,977 A * 1/1985 Arai ...................... C30B 25/105
118/725
4,649,261 A 3/1987 Sheets ........................... 219/390
(Continued)

FOREIGN PATENT DOCUMENTS

CN 1428828 A 7/2003
JP 60-258928 12/1985
(Continued)

OTHER PUBLICATIONS

Taiwanese Office Action dated Dec. 27, 2016 issued for a Taiwanese counterpart application with English partial translation of the portions relevant to prior-art based rejections of the Taiwanese Office Action based on Japanese translation.
(Continued)

*Primary Examiner* — Tu B Hoang
*Assistant Examiner* — Masahiko Muranami
(74) *Attorney, Agent, or Firm* — Ostrolenk Faber LLP

(57) ABSTRACT

A plurality of flash lamps that irradiate a semiconductor wafer with flash light are arrayed in a plane. The array of the plurality of flash lamps is divided into two zones: a central zone including a region opposed to a central portion of the semiconductor wafer to be treated, and a peripheral zone outside the central zone. During flash light irradiation, an emission time of a flash lamp belonging to the peripheral zone is set to be longer than an emission time of a flash lamp belonging to the central zone. Thus, a greater amount of flash light is applied to the peripheral portion of the semiconductor wafer, where a temperature drop is relatively likely to occur, than to the central portion thereof, thus preventing a relative temperature drop in the peripheral portion of the semiconductor wafer during flash heating.

2 Claims, 11 Drawing Sheets

(51) Int. Cl.
  *H01L 21/67* (2006.01)
  *H05B 3/00* (2006.01)
  *H01L 21/687* (2006.01)

(52) U.S. Cl.
  CPC ..... *H01L 21/68742* (2013.01); *H05B 1/0233* (2013.01); *H05B 3/0047* (2013.01)

(58) Field of Classification Search
  USPC ..... 392/418; 219/411, 390, 405, 492, 121.6, 219/385, 388, 412, 414, 118, 121.85, 250, 219/486, 501, 724, 762; 438/530, 795, 438/149, 167, 197, 300, 302, 350, 486, 438/79
  See application file for complete search history.

(56) References Cited

U.S. PATENT DOCUMENTS

| | | | |
|---|---|---|---|
| 8,124,168 B2* | 2/2012 | Tada | C23C 16/46 118/712 |
| 8,173,937 B2 | 5/2012 | Yokouchi | 219/411 |
| 2003/0068903 A1* | 4/2003 | Suzuki | H01L 21/67115 438/799 |
| 2003/0132692 A1 | 7/2003 | Eguchi | |
| 2003/0183612 A1* | 10/2003 | Timans | C30B 31/12 219/390 |
| 2006/0018639 A1 | 1/2006 | Ramamurthy et al. | 392/416 |
| 2006/0197454 A1* | 9/2006 | Mizukawa | H01K 7/00 315/46 |
| 2006/0228818 A1 | 10/2006 | Chacin et al. | 438/18 |
| 2007/0212837 A1 | 9/2007 | Mizuno et al. | |
| 2008/0143268 A1* | 6/2008 | Torikai | H05B 41/30 315/195 |
| 2008/0169282 A1 | 7/2008 | Sorabji et al. | 219/444.1 |
| 2008/0214020 A1 | 9/2008 | Ito et al. | |
| 2008/0219650 A1* | 9/2008 | Suzuki | H01L 21/67115 392/408 |
| 2012/0057855 A1* | 3/2012 | Yokouchi | H01L 21/67115 392/407 |
| 2012/0244725 A1* | 9/2012 | Fuse | H01L 21/26513 438/799 |
| 2014/0206108 A1* | 7/2014 | Kiyama | H01L 21/67115 438/5 |
| 2017/0133247 A1 | 5/2017 | Kiyama | |

FOREIGN PATENT DOCUMENTS

| | | |
|---|---|---|
| JP | 2003-197555 A | 7/2003 |
| JP | 2005-527972 | 9/2005 |
| JP | 2008-192924 A | 8/2008 |
| JP | 2011-060897 A | 3/2011 |
| JP | 2012-222056 A | 11/2012 |
| JP | 2014-143298 A | 8/2014 |
| WO | WO 03/085343 A1 | 10/2003 |
| WO | WO 2005/112088 A1 | 11/2005 |

OTHER PUBLICATIONS

Taiwanese Office Action dated May 26, 2017 with English translation based on Japanese translation of same. Only portions relevant to prior-art based rejections have been translated.

Office Action dated May 15, 2018 in counterpart Chinese Patent Application No. 201610319864.9 with Japanese translation and English partial translation based on the Japanese translation. Portions relevant to prior art based rejections are translated.

Office Action dated Jan. 14, 2019 issued in corresponding Chinese Application No. 2016103198649 and English translation of the Office Action based on the Japanese translation attached.

Office Action dated Jan. 8, 2020 and Search Report in counterpart Taiwanese Patent Application No. 105114332 with Japanese translation and English translation based on Japanese translation.

Office Action dated Oct. 9, 2018 in counterpart Japanese Patent Application No. 2015-098139 with partial English translation. Portions relevant to prior-art based rejections are translated.

* cited by examiner

F I G. 4
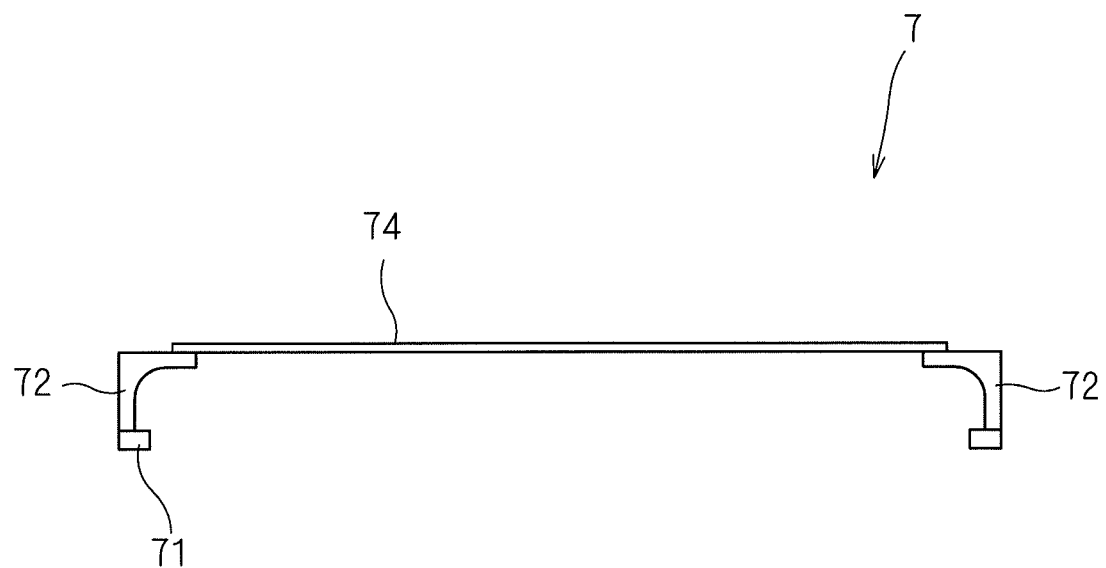

F I G. 6
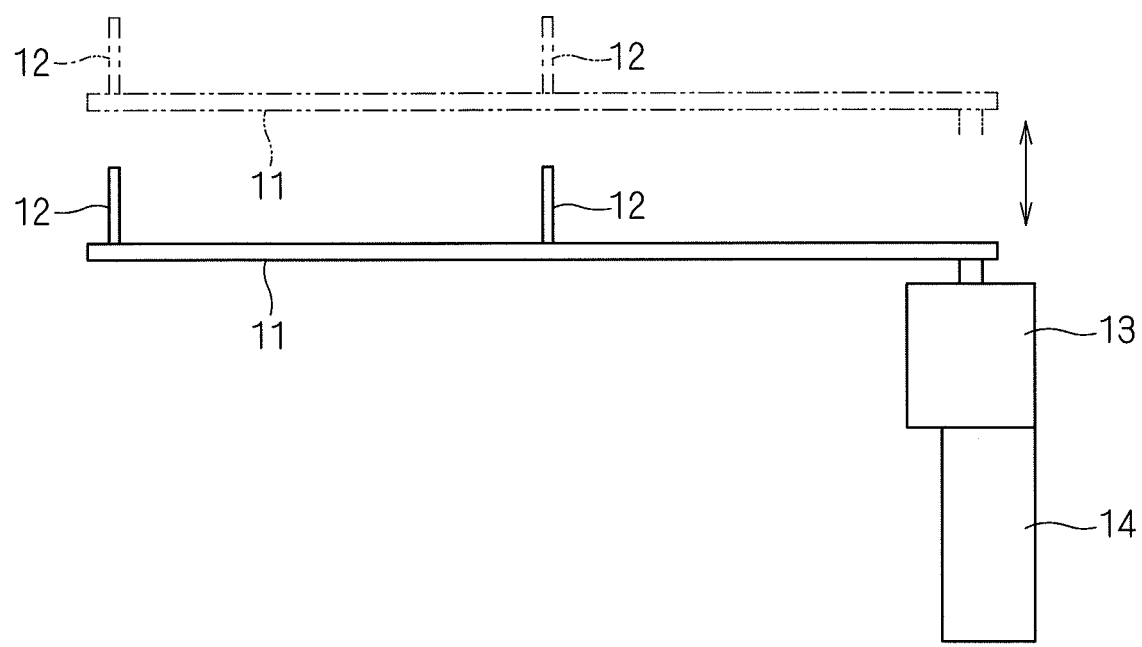

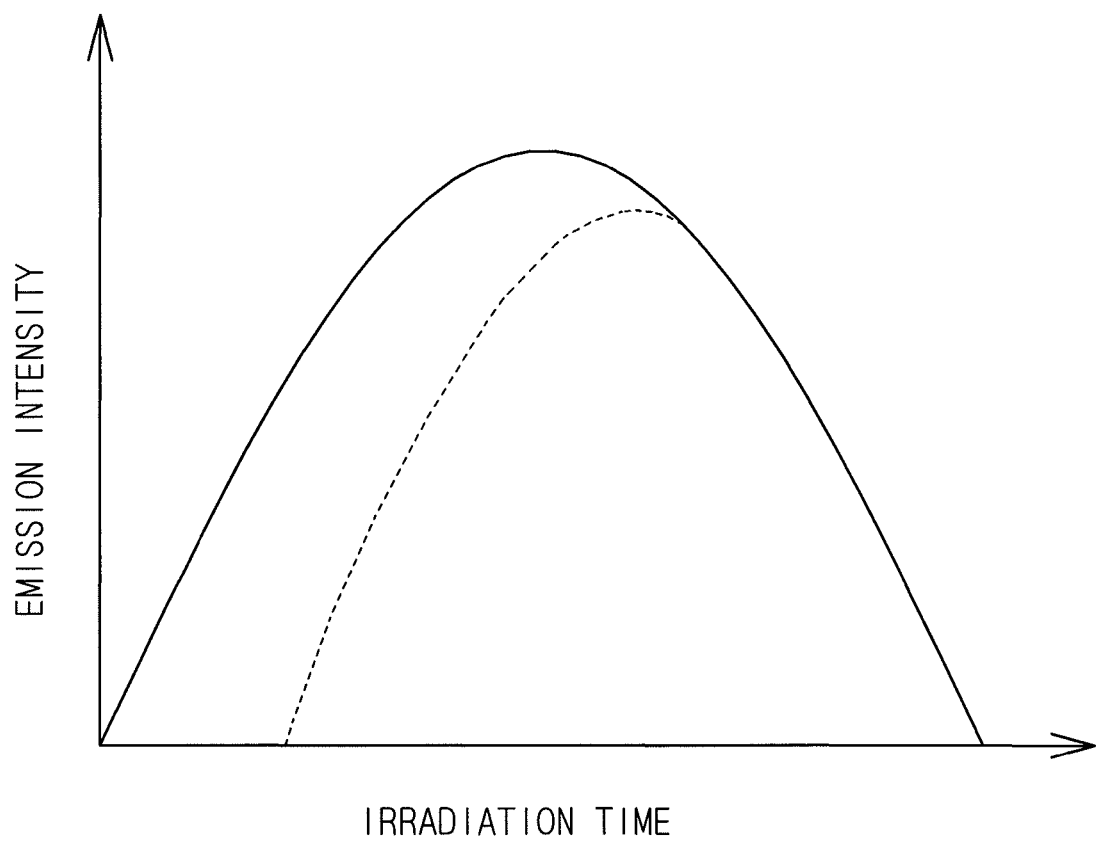
F I G . 1 1

LIGHT-IRRADIATION HEAT TREATMENT METHOD AND HEAT TREATMENT APPARATUS

BACKGROUND OF THE INVENTION

Field of the Invention

The present invention relates to a heat treatment method and a heat treatment apparatus for irradiating a thin plate-shaped precision electronic substrate (hereinafter referred to simply as a "substrate"), such as a semiconductor wafer, with flash light to heat the substrate.

Description of the Background Art

In the process of manufacturing a semiconductor device, impurity doping is an essential step for forming a pn junction in a semiconductor wafer. At present, impurity doping is typically performed by ion implantation and subsequent annealing. Ion implantation is a technique of causing ions of impurity elements such as boron (B), arsenic (As), or phosphorus (P) to collide against the semiconductor wafer with high acceleration voltage, thereby physically implanting the impurities into the semiconductor wafer. The implanted impurities are activated by annealing. At this time, if the annealing time becomes about several seconds or longer, the implanted impurities are deeply diffused by heat. This results in a junction depth much greater than an intended depth, which may constitute a hindrance to good device formation.

In recent years, attention has been given to flash lamp annealing (FLA) that is an annealing technique of heating a semiconductor wafer in an extremely short time. The flash lamp annealing is a heat treatment technique in which xenon flash lamps (the term "flash lamps" as used hereinafter refers to "xenon flash lamps") are used to irradiate a surface of a semiconductor wafer with flash light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of the light emitted from the xenon flash lamps is shorter than that of the light emitted from conventional halogen lamps, and approximately coincides with a fundamental absorption band of a silicon semiconductor wafer. Thus, when flash light is applied to the semiconductor wafer from the xenon flash lamps, the temperature of the semiconductor wafer can be raised rapidly, with only a small amount of light transmitted through the semiconductor wafer. It has also been turned out that flash light irradiation, that is, the irradiation of a semiconductor wafer with flash light in an extremely short time of several milliseconds or less allows a selective temperature rise only the surface of the semiconductor wafer and its vicinity. Therefore, the temperature rise in an extremely short time with the xenon flash lamps enables only the activation of impurities without deep diffusion of the impurities.

As examples of a heat treatment apparatus including such xenon flash lamps, U.S. Pat. No. 4,649,261 and US 2003/0183612 A1 disclose heat treatment apparatuses that perform desirable heat treatment with a combination of pulsed light-emitting lamps such as flash lamps that are arranged on the front side of a semiconductor wafer and continuous lighting lamps such as halogen lamps that are arranged on the rear side of the semiconductor wafer. In the heat treatment apparatuses disclosed in U.S. Pat. No. 4,649,261 and US 2003/0183612 A1, a semiconductor wafer is preheated to a certain degree of temperature with, for example, halogen lamps, and then, the temperature of the semiconductor wafer is raised to a desired treatment temperature by pulse heating with the flash lamps.

Although preheating with the halogen lamps, as disclosed in U.S. Pat. No. 4,649,261 and US 2003/0183612 A1, has a processing advantage that the temperature of a semiconductor wafer will be raised to a relatively high preheating temperature in a short time, it may cause the temperature of the peripheral portion of the wafer to be relatively lower than the temperature of the central portion of the wafer. Conceivable causes of such an uneven temperature distribution include heat radiation from the peripheral portion of the semiconductor wafer and heat conduction from the peripheral portion of the semiconductor wafer to a relatively low-temperature quartz susceptor.

If flash light is applied from flash lamps while the temperature distribution in the surface of the semiconductor wafer has been uneven during preheating, a maximum surface temperature of the semiconductor wafer also results in an uneven temperature distribution in the surface thereof. This leads to variations in the extent of the activation of impurities, also resulting in an uneven sheet resistance value.

SUMMARY OF THE INVENTION

The present invention is directed to a heat treatment method for irradiating a substrate with flash light from a plurality of flash lamps arrayed in a plane to heat the substrate.

In one aspect of the present invention, a heat treatment method includes (a) irradiating a substrate with light from a halogen lamp to perform preheating, and (b) irradiating the substrate with flash light from the plurality of flash lamps. In the step (b), a time for flash light irradiation in a second zone of an array of the plurality of flash lamps is longer than a time for flash light irradiation in a first zone thereof. The first zone includes a region opposed to a central portion of the substrate held in a chamber, and the second zone is located outside the first zone.

A greater amount of flash light is applied to the peripheral portion of the substrate, where a temperature drop is relatively likely to occur, than to the central portion thereof, preventing a relative temperature drop in the peripheral portion of the substrate.

Preferably, the flash light irradiation in the first zone and the flash light irradiation in the second zone are started simultaneously.

The flash light irradiation to the peripheral portion of the substrate is continuously performed even after the flash light irradiation to the central portion thereof is completed, thus preventing a temperature drop in the central portion associated with the heat transfer to the peripheral portion of the substrate where heat dissipation is likely to occur.

Preferably, the flash light irradiation in the first zone and the flash light irradiation in the second zone are completed simultaneously.

The temperature of the substrate is decreased entirely at a uniform cooling rate.

Preferably, a discharge voltage of a flash lamp belonging to the second zone is higher than a discharge voltage of a flash lamp belonging to the first zone.

The intensity of the flash light applied to the peripheral portion of the substrate is higher than the intensity of the flash light applied to the central portion thereof, thus more reliably preventing a relative temperature drop in the peripheral portion of the substrate.

The present invention is also directed to a heat treatment apparatus that irradiates a substrate with flash light to heat the substrate.

In another aspect of the present invention, a heat treatment apparatus includes a chamber that houses a substrate, a holding part that holds a substrate in the chamber, an array of a plurality of flash lamps arranged in a plane, and an irradiation time controller that defines times for flash light irradiation of the plurality of flash lamps. The irradiation time controller is configured to define the times for the flash light irradiation of the plurality of flash lamps such that a time for flash light irradiation in a second zone of the array of the plurality of flash lamps is longer than a time for flash light irradiation in a first zone thereof. The first zone includes a region opposed to a central portion of the substrate held in a chamber, and the second zone is located outside the first zone.

A greater amount of flash light is applied to the peripheral portion of the substrate, where a temperature drop is relatively likely to occur, than to the central portion thereof, preventing a relative temperature drop in the peripheral portion of the substrate.

Preferably, the irradiation time controller simultaneously starts the flash light irradiation in the first zone and the flash light irradiation in the second zone.

The flash light irradiation to the peripheral portion of the substrate is continuously performed even after the flash light irradiation to the central portion thereof is completed, thus preventing a temperature drop in the central portion associated with the heat transfer to the peripheral portion of the substrate where heat dissipation is likely to occur.

Preferably, the irradiation time controller simultaneously completes the flash light irradiation in the first zone and the flash light irradiation in the second zone.

The temperature of the substrate is decreased entirely at a uniform cooling rate.

Preferably, a discharge voltage of a capacitor that supplies electric charge to a flash lamp belonging to the second zone is higher than a discharge voltage of a capacitor that supplies electric charge to a flash lamp belonging to the first zone.

The intensity of the flash light applied to the peripheral portion of the substrate is higher than the intensity of the flash light applied to the central portion thereof, thus more reliably preventing a relative temperature drop in the peripheral portion of the substrate.

The present invention therefore has an object to prevent a relative temperature drop in the peripheral portion of a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a side view of the holding part as viewed from one side;

FIG. 6 is a side view of the transfer mechanism;

FIG. 11 illustrates the profile of emission intensity of flash lamps according to a second preferred embodiment.

DESCRIPTION OF THE PREFERRED EMBODIMENTS

Hereinafter, preferred embodiments of the present invention will be described in detail with reference to the accompanying drawings.

First Preferred Embodiment

Figure 1:
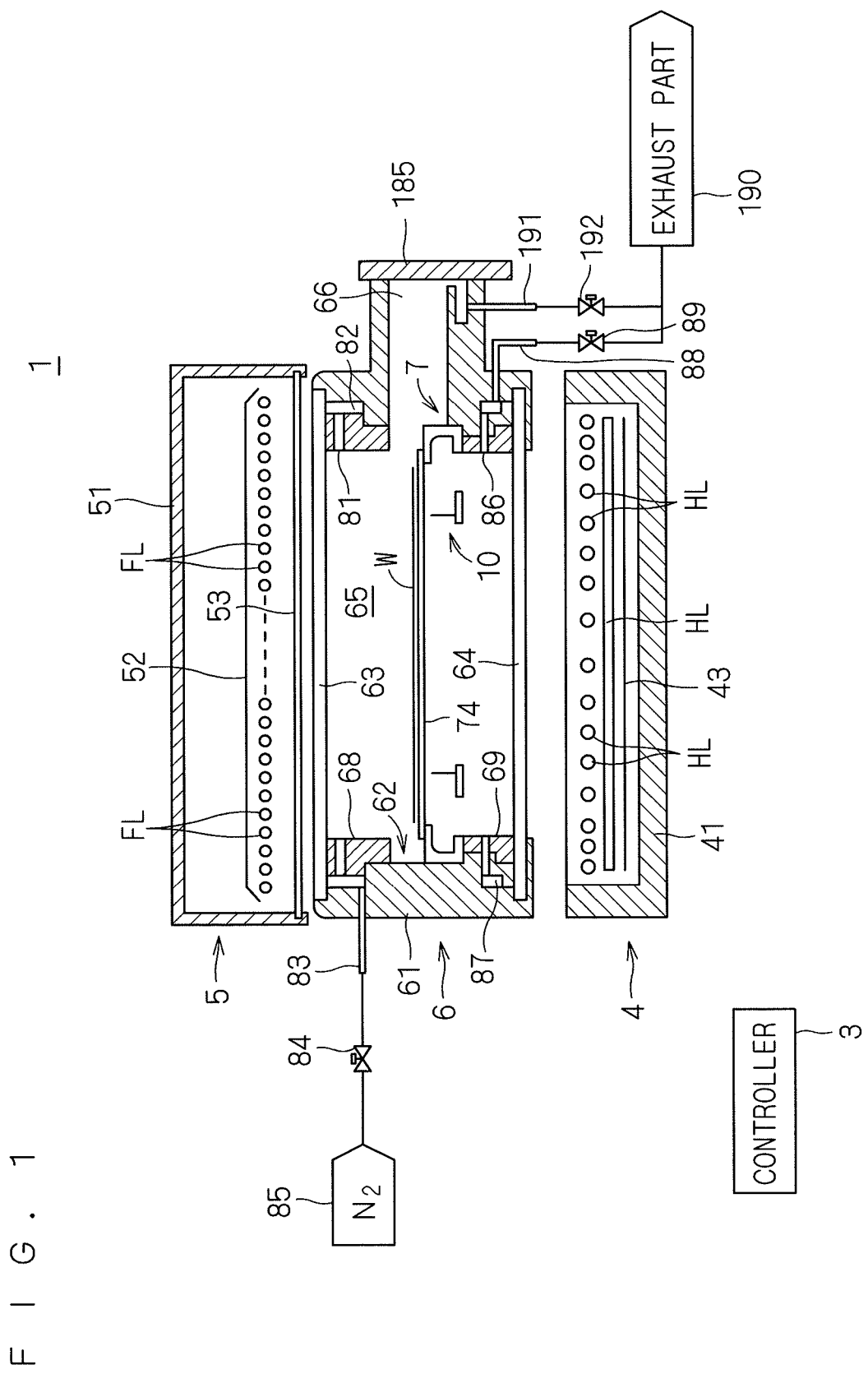
FIG. 1 is a longitudinal cross-sectional view of a configuration of a heat treatment apparatus according to the present invention.

FIG. 1 is a longitudinal cross-sectional view of a configuration of a heat treatment apparatus 1 according to the present invention. The heat treatment apparatus 1 of the present preferred embodiment is a flash-lamp annealing apparatus for irradiating a disk-shaped semiconductor wafer W, which is a substrate, with flash light to heat the semiconductor wafer W. The diameter size of the semiconductor wafer W to be treated is not particularly limited, which is, for example, 300 mm or 450 mm. The semiconductor wafer W is doped with impurities before being transported into the heat treatment apparatus 1, and the doped impurities are activated through heat treatment by the heat treatment apparatus 1. For easy understanding of drawings, the dimensions and numbers of respective constituent elements may be exaggerated or simplified as necessary in FIG. 1 and subsequent drawings.

The heat treatment apparatus 1 includes a chamber 6 that houses the semiconductor wafer W, a flash heating part 5 with a plurality of built-in flash lamps FL, and a halogen heating part 4 with a plurality of built-in halogen lamps HL. The flash heating part 5 is located above the chamber 6, and the halogen heating part 4 is located below the chamber 6. The heat treatment apparatus 1 further includes, within the chamber 6, a holding part 7 that holds the semiconductor wafer W in a horizontal position and a transfer mechanism 10 for transferring the semiconductor wafer W between the holding part 7 and the outside of the heat treatment apparatus 1. The heat treatment apparatus 1 further includes a controller 3 that controls operating mechanisms located in the halogen heating part 4, the flash heating part 5, and the chamber 6 for heat treatment of the semiconductor wafer W.

The chamber 6 is configured by mounting quartz chamber windows on the top and bottom of a tubular chamber side portion 61. The chamber side portion 61 has a substantially tubular shape with upper and lower openings, the upper opening being equipped with and closed by an upper chamber window 63, the lower opening being equipped with and closed by a lower chamber window 64. The upper chamber window 63, which forms the ceiling of the chamber 6, is a disk-shaped member made of quartz and functions as a quartz window that allows the flash light emitted from the flash heating part 5 to be transmitted into the chamber 6. The lower chamber window 64, which forms the floor of the chamber 6, is also a disk-shaped member made of quartz and functions as a quartz window that allows the light emitted from the halogen heating part 4 to be transmitted into the chamber 6.

Also, a reflection ring 68 is mounted on the upper portion of the inner wall surface of the chamber side portion 61, and a reflection ring 69 is mounted on the lower portion thereof. The reflection rings 68 and 69 both have an annular shape. The upper reflection ring 68 is mounted by being fitted into the chamber side portion 61 from above. On the other hand, the lower reflection ring 69 is mounted by being fitted into the chamber side portion 61 from below and fastened with screws (not shown). In other words, the reflection rings 68 and 69 are both removably mounted on the chamber side portion 61. The inner space of the chamber 6, that is, the space surrounded by the upper chamber window 63, the lower chamber window 64, the chamber side portion 61, and the reflection rings 68 and 69, is defined as a heat treatment space 65.

The reflection rings 68 and 69 mounted on the chamber side portion 61 form a recessed portion 62 in the inner wall surface of the chamber 6. In other words, the recessed portion 62 is surrounded by the central portion of the inner wall surface of the chamber side portion 61 on which the reflection rings 68 and 69 are not mounted, the lower end surface of the reflection ring 68, and the upper end surface of the reflection ring 69. The recessed portion 62 is horizontally formed in an annular shape in the inner wall surface of the chamber 6 and surrounds the holding part 7 that holds the semiconductor wafer W.

The chamber side portion 61 and the reflection rings 68 and 69 are made of a metal material (e.g., stainless steel) having excellent strength and excellent heat resistance. The inner circumferential surfaces of the reflection rings 68 and 69 are mirror-finished by electrolytic nickel plating.

The chamber side portion 61 has a transport opening (throat) 66 through which the semiconductor wafer W is transported into and out of the chamber 6. The transport opening 66 is openable and closable with a gate valve 185. The transport opening 66 is communicatively connected to the outer circumferential surface of the recessed portion 62. When opened by the gate valve 185, thus, the transport opening 66 allows the semiconductor wafer W to be transported into and out of the heat treatment space 65 from the transport opening 66 through the recessed portion 62. When the transport opening 66 is closed by the gate valve 185, the heat treatment space 65 in the chamber 6 becomes an enclosed space.

The upper portion of the inner wall of the chamber 6 has a gas supply port 81 through which a treatment gas (in the present preferred embodiment, a nitrogen gas ($N_2$)) is supplied into the heat treatment space 65. The gas supply port 81 is located at a position above the recessed portion 62 and may be located in the reflection ring 68. The gas supply port 81 is communicatively connected to a gas supply pipe 83 via a buffer space 82 that is formed in an annular shape inside the side wall of the chamber 6. The gas supply pipe 83 is connected to a nitrogen-gas supply source 85. Also, a valve 84 is interposed in the path of the gas supply pipe 83. When the valve 84 is open, a nitrogen gas is supplied from the nitrogen-gas supply source 85 into the buffer space 82. The nitrogen gas flowing into the buffer space 82 flows throughout the buffer space 82 that has a lower fluid resistance than the gas supply port 81, and is supplied through the gas supply port 81 into the heat treatment space 65. The treatment gas is not limited to a nitrogen gas and may be an inert gas such as argon (Ar) or helium (He) or a reactant gas such as oxygen ($O_2$), hydrogen ($H_2$), chlorine ($Cl_2$), hydrogen chloride (HCl), ozone ($O_3$), or ammonia ($NH_3$).

On the other hand, the lower portion of the inner wall of the chamber 6 has a gas exhaust port 86 through which the gas in the heat treatment space 65 is exhausted. The gas exhaust port 86 is located at a position below the recessed portion 62 and may be located in the reflection ring 69. The gas exhaust port 86 is communicatively connected to a gas exhaust pipe 88 via a buffer space 87 that is formed in an annular shape inside the side wall of the chamber 6. The gas exhaust pipe 88 is connected to an exhaust part 190. Also, a valve 89 is interposed in the path of the gas exhaust pipe 88. When the valve 89 is open, the gas in the heat treatment space 65 is exhausted from the gas exhaust port 86 through the buffer space 87 into the gas exhaust pipe 88. Alternatively, a plurality of gas supply ports 81 and a plurality of gas exhaust ports 86 may be provided along the circumference of the chamber 6, or the gas supply port 81 and the gas exhaust port 86 may be slit-shaped. Still alternatively, the nitrogen-gas supply source 85 and the exhaust part 190 may be mechanisms provided in the heat treatment apparatus 1 or may be utilities in a factory where the heat treatment apparatus 1 is installed.

One end of the transport opening 66 is also connected with a gas exhaust pipe 191 through which the gas in the heat treatment space 65 is exhausted. The gas exhaust pipe 191 is connected to the exhaust part 190 via a valve 192. When the valve 192 is opened, the gas in the chamber 6 is exhausted through the transport opening 66.

Figure 2:
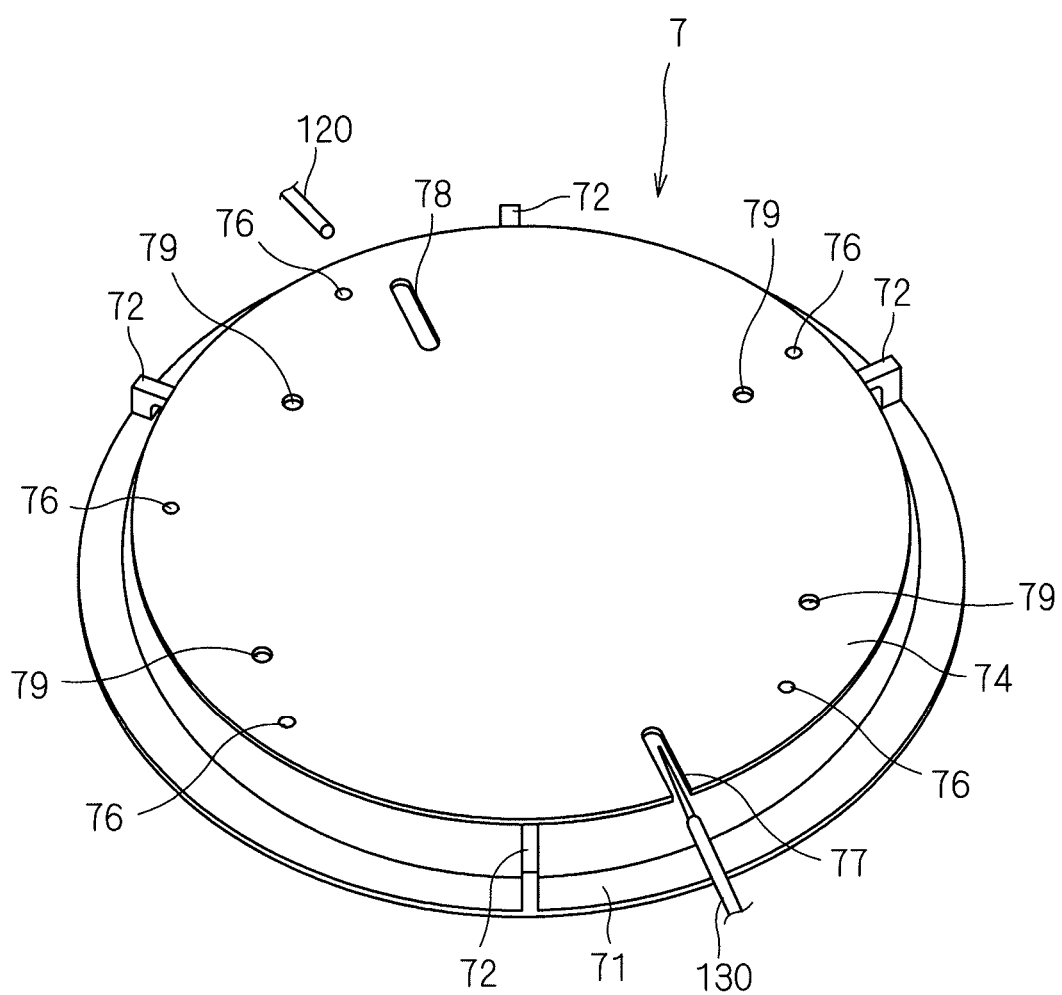
FIG. 2 is a perspective view of an entire external appearance of a holding part.
Figure 3:
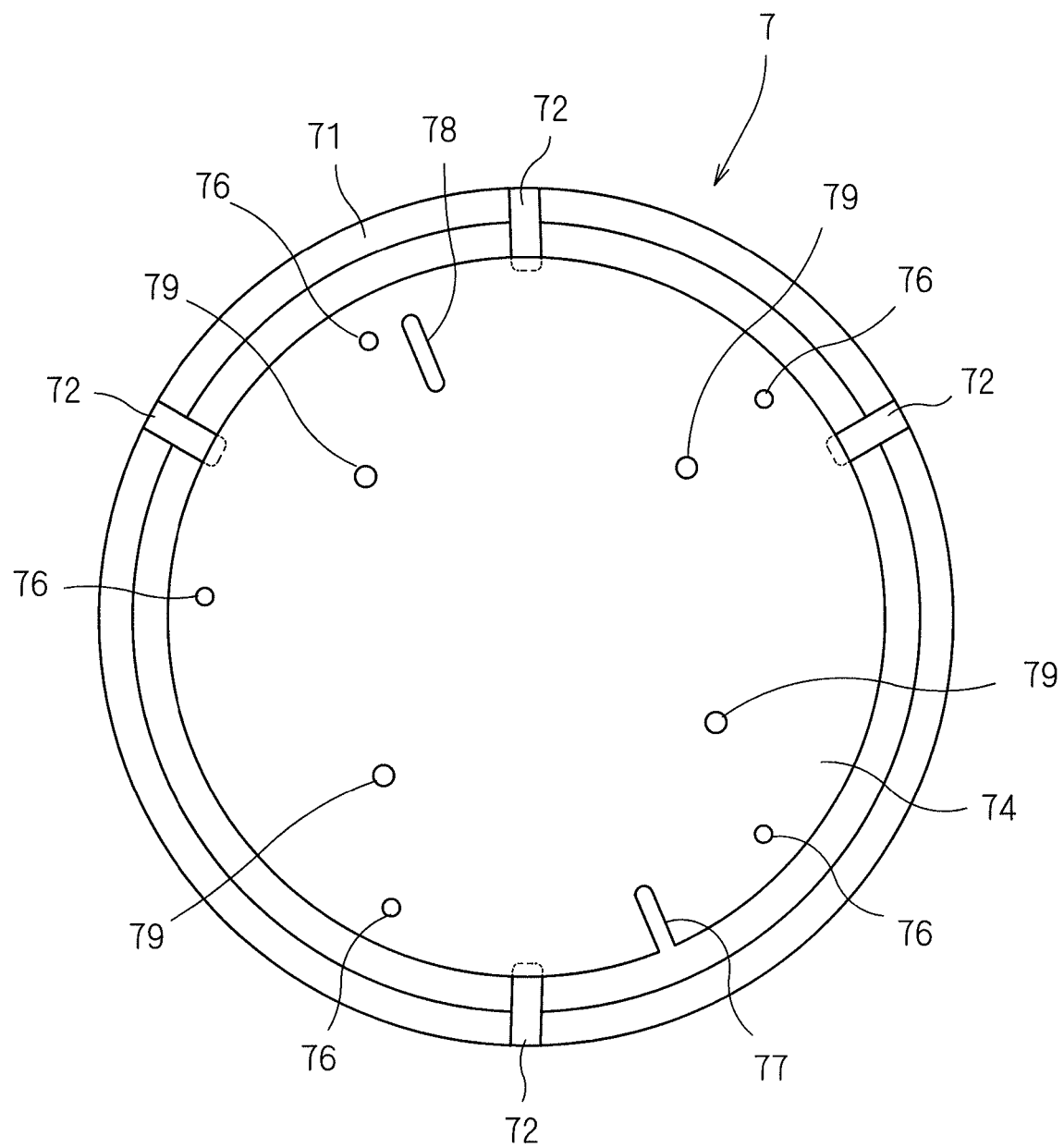
FIG. 3 is a plan view of the holding part as viewed from above.

FIG. 2 is a perspective view of the entire external appearance of the holding part 7. FIG. 3 is a plan view of the holding part 7 as viewed from above, and FIG. 4 is a side view of the holding part 7 as viewed from one side. The holding part 7 includes a base ring 71, connecting parts 72, and a susceptor 74. The base ring 71, the connecting parts 72, and the susceptor 74 are each made of quartz. In other words, the entire holding part 7 is made of quartz.

The base ring 71 is an annular quartz member. The base ring 71 is placed on the bottom surface of the recessed portion 62 to be supported by the wall surface of the chamber 6 (see FIG. 1). On the upper surface of the base ring 71 having an annular shape, a plurality of (in the present preferred embodiment, four) connecting parts 72 are provided upright along the circumference of the base ring 71. The connecting parts 72 are also quartz members and fixedly attached to the base ring 71 by welding. Note that the base ring 71 may have an arc shape that is an annular shape with a missing part.

The susceptor 74 having a flat plate shape is supported by the four connecting parts 72 provided on the base ring 71. The susceptor 74 is a substantially circular flat plate-shaped member made of quartz. The diameter of the susceptor 74 is greater than the diameter of the semiconductor wafer W. In other words, the susceptor 74 has a plane size greater than that of the semiconductor wafer W. On the upper surface of the susceptor 74, a plurality of (in the preferred embodiment, five) guide pins 76 are provided upright. The five guide pins 76 are provided along the circumference that is concentric with the outer circumferential circle of the susceptor 74. The diameter of the circle along which the five guide pins 76 are located is slightly greater than the diameter of the semiconductor wafer W. Each guide pins 76 is made of quartz. Note that the guide pins 76 may be processed integrally with the susceptor 74 from a quartz ingot, or may be processed separately from the susceptor 74 and then attached to the susceptor 74 by, for example, welding.

The four connecting parts 72 provided upright on the base ring 71 and the lower surface of the circumferential portion of the susceptor 74 are fixedly attached by welding. In other words, the susceptor 74 and the base ring 71 are fixedly connected by the connecting parts 72, making the holding part 7 an integral member of quartz. The base ring 71 of the holding part 7 above is supported by the wall surface of the chamber 6, so that the holding part 7 is attached to the chamber 6. With the holding part 7 attached to the chamber 6, the susceptor 74 having a substantially disk shape is held in the horizontal position (the position in which the normal coincides with the vertical direction). The semiconductor wafer W transported into the chamber 6 is placed and held in the horizontal position on the susceptor 74 of the holding part 7. The semiconductor wafer W is placed inward of the circle formed by the five guide pins 76, thus preventing a positional deviation of the semiconductor wafer W in the horizontal direction. Note that the number of guide pins 76 is not limited to five and may be any number that can prevent a positional deviation of the semiconductor wafer W.

As illustrated in FIGS. 2 and 3, the susceptor 74 has an opening 78 and a cut-out portion 77 that vertically penetrate the susceptor 74. The cut-out portion 77 is provided to allow the probe tip of a contact-type thermometer 130 including a thermocouple to pass therethrough. The opening 78 is provided to allow a radiation thermometer 120 to receive radiation (infrared light) applied from the lower surface of the semiconductor wafer W held by the susceptor 74. The susceptor 74 further has four through holes 79 through which lift pins 12 of the transfer mechanism 10, described below, pass to transfer the semiconductor wafer W.

Figure 5:
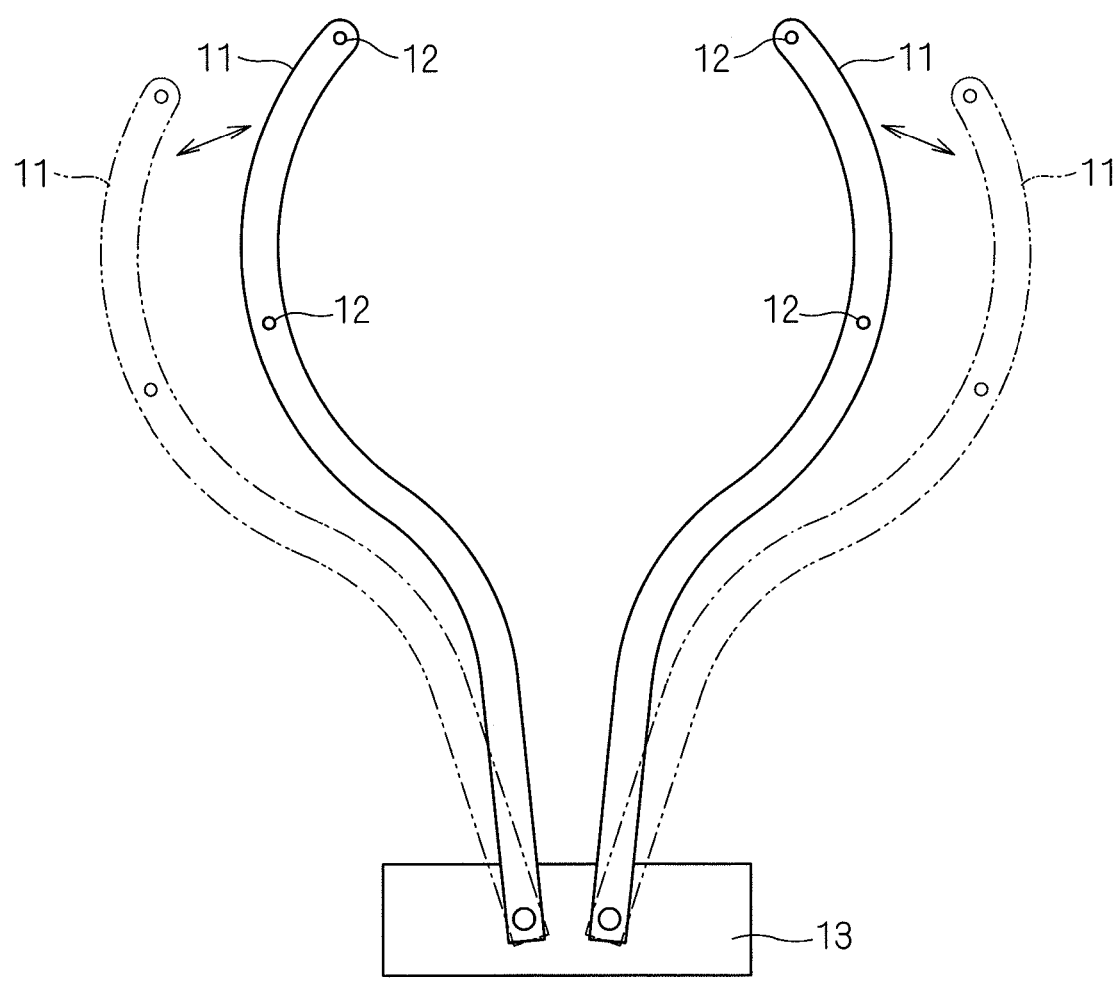
FIG. 5 is a plan view of a transfer mechanism.

FIG. 5 is a plan view of the transfer mechanism 10. FIG. 6 is a side view of the transfer mechanism 10. The transfer mechanism 10 includes two transfer arms 11. The transfer arms 11 have an arc shape extending along a recessed portion 62 having a substantially annular shape. Each transfer arms 11 has two upright lift pins 12. Each transfer arm 11 is pivotal by a horizontal movement mechanism 13. The horizontal movement mechanism 13 horizontally moves the pair of transfer arms 11 between a transfer operation position (a position indicated by the solid line in FIG. 5), at which the semiconductor wafer W is transferred to the holding part 7, and a retraction position (a position indicated by a dashed double-dotted line in FIG. 5), at which the transfer arms 11 do not overlap the semiconductor wafer W held by the holding part 7 in a plan view. The horizontal movement mechanism 13 may be a mechanism for separately pivoting the transfer arms 11 by individual motors, or may be a mechanism for pivoting the pair of transfer arms 11 in conjunction with each other by a single motor using a link mechanism.

The pair of transfer arms 11 are movable upward and downward along with the horizontal movement mechanism 13 by an elevating mechanism 14. When the elevating mechanism 14 moves the pair of transfer arms 11 at the transfer operation position, the four lift pins 12 pass through the through holes 79 (see FIGS. 2 and 3) of the susceptor 74, and the upper ends of the lift pins 12 protrude from the upper surface of the susceptor 74. On the other hand, when the elevating mechanism 14 moves down the pair of transfer arms 11 at the transfer operation position to pull the lift pins 12 out of the through holes 79 and then the horizontal movement mechanism 13 moves the pair of transfer arms 11 to open the pair of transfer arms 11, each transfer arm 11 moves to the retraction position. The retraction positions of the pair of transfer arms 11 are directly above the base ring 71 of the holding part 7. The base ring 71 is placed on the bottom surface of the recessed portion 62, and thus, the retraction positions of the transfer arms 11 are on the inside of the recessed portion 62. Note that an exhaust mechanism (not shown) is also provided in the vicinity of the area where the drive part (the horizontal movement mechanism 13 and the elevating mechanism 14) of the transfer mechanism 10 is provided to allow the atmosphere around the driving part of the transfer mechanism 10 to be exhausted to the outside of the chamber 6.

Referring back to FIG. 1, the flash heating part 5 provided above the chamber 6 includes, inside a casing 51, a light source including a plurality of (in the present preferred embodiment, 30) xenon flash lamps FL, and a reflector 52 provided to cover the light source. The casing 51 of the flash heating part 5 also has a lamp light irradiation window 53 attached to its bottom. The lamp light irradiation window 53 forming the floor of the flash heating part 5 is a plate-shaped window made of quartz. Since the flash heating part 5 is located above the chamber 6, the lamp light irradiation window 53 opposes the upper chamber window 63. The flash lamps FL emit flash light from above the chamber 6 through the light irradiation windows 53 and the upper chamber window 63 to the heat treatment space 65.

The plurality of flash lamps FL are each a rod-shaped lamp having an elongated cylindrical shape and are arranged in a plane such that their longitudinal directions are parallel to one another along the major surface of the semiconductor wafer W held by the holding part 7 (i.e., along the horizontal direction). The plane formed by the array of the flash lamps FL is thus also a horizontal plane.

Figure 8:
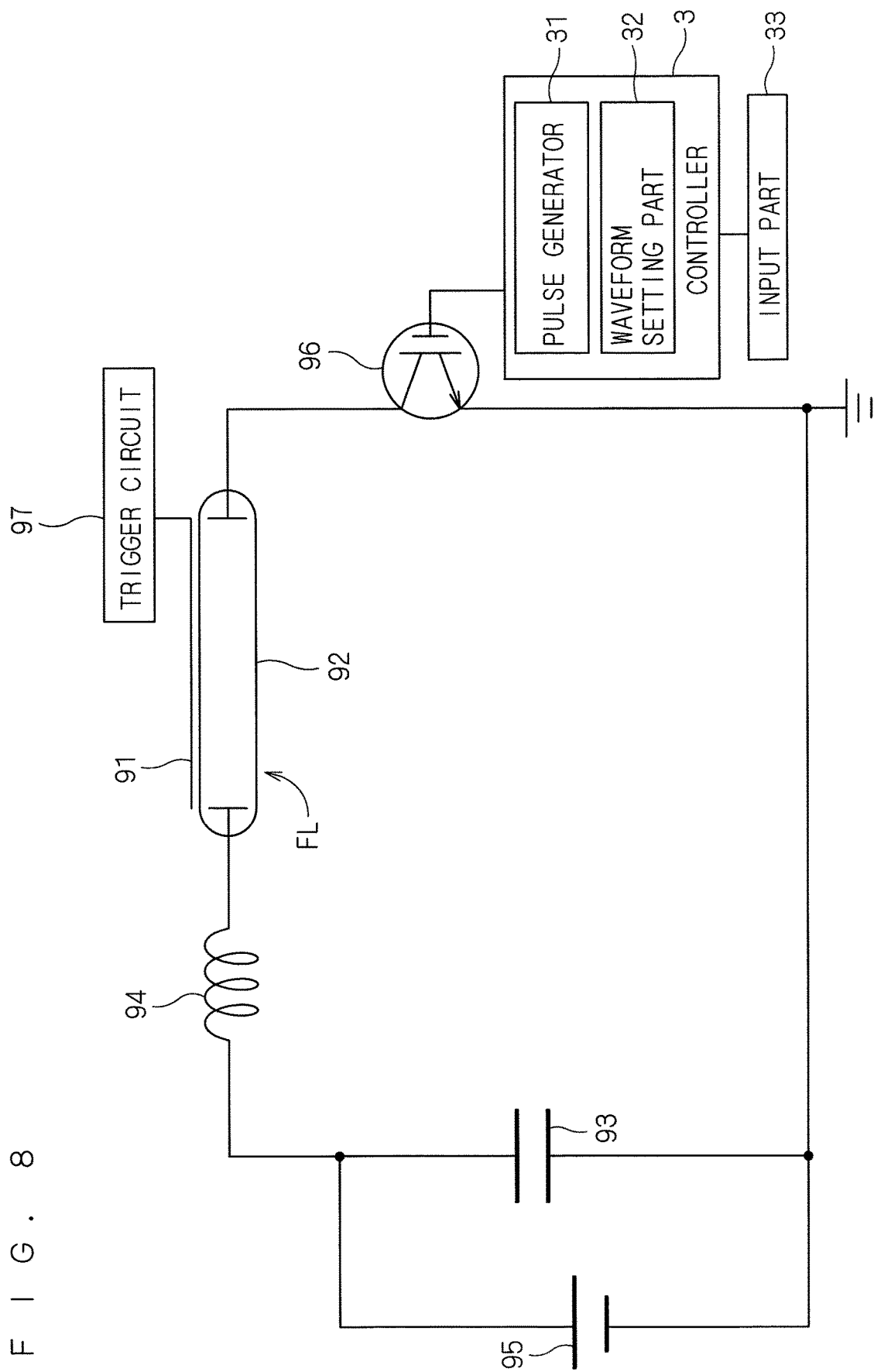
FIG. 8 illustrates a drive circuit for a flash lamp.

FIG. 8 illustrates a drive circuit for the flash lamp FL. As illustrated in FIG. 8, a capacitor 93, a coil 94, a flash lamp FL, and an insulated gate bipolar transistor (IGBT) 96 are connected in series. As illustrated in FIG. 8, also, the controller 3 includes a pulse generator 31 and a waveform setting part 32 and is connected to an input part 33. The input part 33 may be any well-known device such as a keyboard, mouse, or touch panel. The waveform setting part 32 sets a waveform of a pulse signal based on the entry of the input part 33, and the pulse generator 31 generates a pulse signal in accordance with the waveform.

The flash lamp FL includes a rod-shaped glass tube (discharge tube) 92 and a trigger electrode 91. The glass tube 92 is filled with a xenon gas and has an anode and a cathode at opposite ends. The trigger electrode 91 is provided on the outer circumferential surface of the glass tube 92. The capacitor 93 is applied with a predetermined voltage by a power supply unit 95 and is charged with electric charge corresponding to the applied voltage (charge voltage). The trigger electrode 91 can be applied with high voltage by a trigger circuit 97. The controller 3 controls the timing at which the trigger circuit 97 applies voltage to the trigger electrode 91.

The IGBT 96, which is a bipolar transistor including a metal oxide semiconductor field effect transistor (MOSFET) built in its gate part, is a switching element suitable for handling high power. A pulse signal is applied to the gate of the IGBT 96 from the pulse generator 31 of the controller 3. The IGBT 96 turns on upon application of a voltage not less than a predetermined value (high voltage) to the gate of the IGBT 96, while the IGBT 96 turns off upon application of a voltage less than the predetermined value (low voltage) to the gate thereof. In this way, the drive circuit including the flash lamp FL is turned on and off by the IGBT 96. Turning the IGBT 96 on and off interrupts the connection between the flash lamp FL and its corresponding capacitor 93, so that the current flowing through the flash lamp FL is on-off controlled.

Even when the IGBT 96 turns on and high voltage is applied across the electrodes of the glass tube 92 while the capacitor 93 is charged, no current flows through the glass tube 92 in a normal state, because a xenon gas is an electrical insulator. When electrical breakdown occurs by the trigger circuit 97 applying a high voltage to the trigger electrode 91, however, a current flows instantaneously into the glass tube 92 due to the discharge across the electrodes at the opposite ends, and light is emitted by excitation of the xenon atoms or molecules at that time.

The drive circuit as illustrated in FIG. 8 is provided individually in each of the plurality of flash lamps FL of the flash heating part 5. In the present preferred embodiment, 30 flash lamps FL are arranged in a plane, and accordingly, 30 drive circuits as shown in FIG. 8 are correspondingly provided. Thus, the respective currents flowing through the 30 flash lamps FL are individually on-off controlled by their corresponding IGBTs 96.

Figure 9:
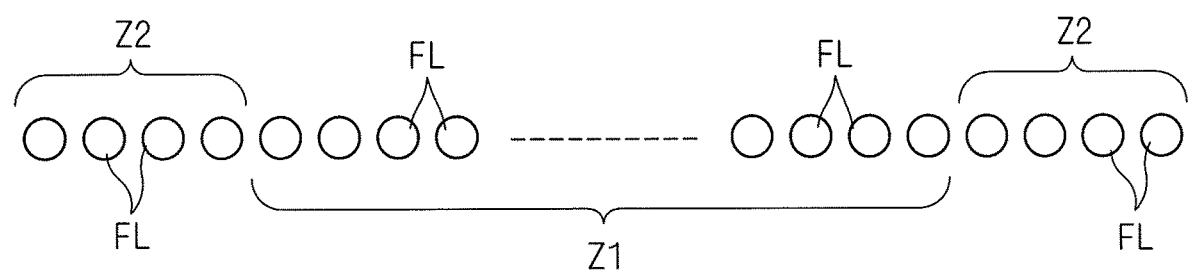
FIG. 9 illustrates the array of a plurality of flash lamps.

FIG. 9 illustrates the array of the plurality of flash lamps FL. In the present preferred embodiment, the planar array of 30 flash lamps FL is divided into two regions: a peripheral zone (second zone) Z2 and a central zone (first zone) Z1. The peripheral zone Z2 includes eight flash lamps FL, or, four flash lamps FL close to one end and four flash lamps FL close to the other end in the array. The central zone Z1 includes 22 flash lamps FL except for the four flash lamps FL at one end and the four flash lamps FL at the other end. The central zone Z1 includes a region opposed to the central portion of the semiconductor wafer W held by the holding part 7 in the chamber 6. The peripheral zone Z2 is located outside the central zone Z1 in the planar array of the flash lamps FL. The times for flash light irradiation of the 30 flash lamps FL are controlled per zone by the drive circuits including the IGBTs 96, which will be described below in detail.

Referring back to FIG. 1, the reflector 52 is provided above the plurality of flash lamps FL to cover all of the flash lamps FL. A basic function of the reflector 52 is to reflect the flash light emitted from the plurality of flash lamps FL toward the heat treatment space 65. The reflector 52 is made of an aluminum alloy plate, and its surface (the surface facing the flash lamps FL) is roughened by blasting.

The halogen heating part 4 provided below the chamber 6 includes a plurality of (in the present preferred embodiment, 40) built-in halogen lamps HL inside a casing 41. The halogen heating part 4 is a light irradiation part that heats the semiconductor wafer W with the plurality of halogen lamps HL that emit light from below the chamber 6 through the lower chamber window 64 to the heat treatment space 65.

Figure 7:
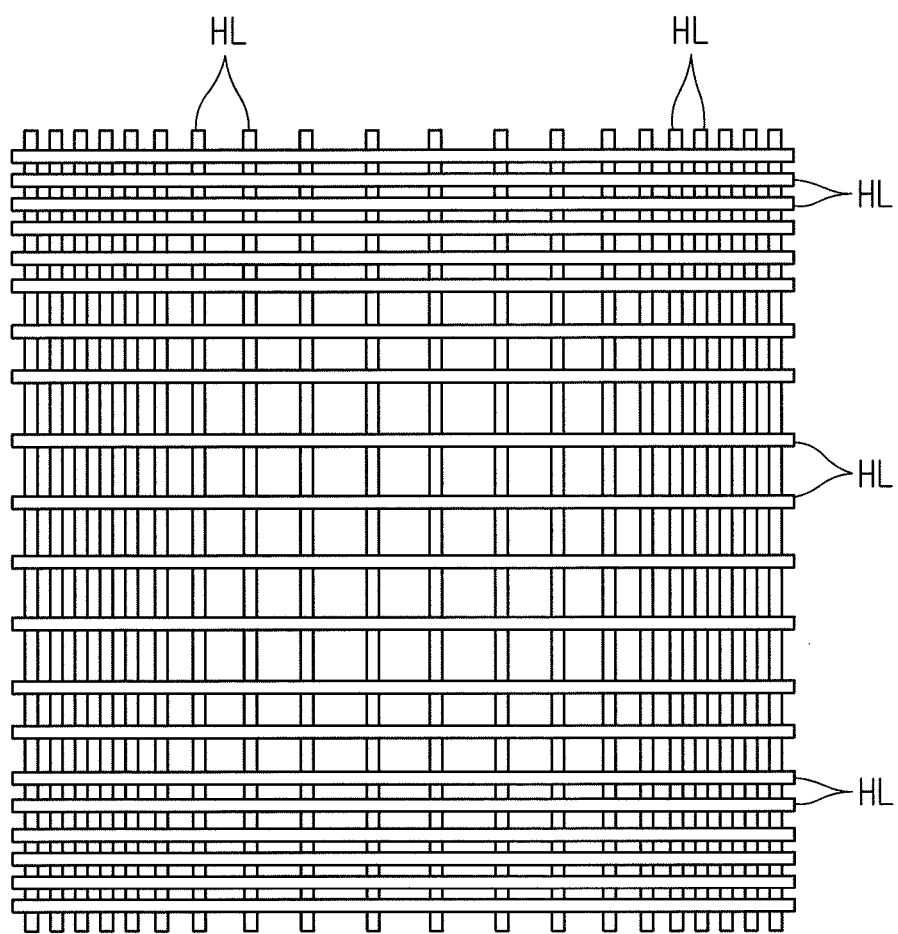
FIG. 7 is a plan view of the layout of a plurality of halogen lamps.

FIG. 7 is a plan view illustrating the layout of the plurality of halogen lamps HL. The 40 halogen lamps HL are divided into and arranged in upper and lower rows. The upper row closer to the holding part 7 includes an array of 20 halogen lamps HL, and the lower row further from the holding part 7 includes an array of 20 halogen lamps HL. Each halogen lamp HL is a rod-shaped lamp having an elongated cylindrical shape. The 20 halogen lamps HL in the upper row and the 20 halogen lamps HL in the lower row are arranged such that their longitudinal directions are parallel to one another along the major surface of the semiconductor wafer W held by the holding part 7 (i.e., along the horizontal direction). Thus, the planes formed by the array of the halogen lamps HL in the upper row and the plane formed by the array of the halogen lamps HL in the lower row are both horizontal planes.

As illustrated in FIG. 7, in each of the upper and lower rows, the halogen lamps HL are disposed at higher density in the region that opposes the peripheral portion of the semiconductor wafer W held by the holding part 7 than in the region that opposes the central portion of the semiconductor wafer W. In other words, in each of the upper and lower rows, the halogen lamps HL are disposed at shorter pitches in the peripheral portion of the lamp array than in the central portion thereof. This configuration allows a greater amount of light to be applied to the peripheral portion of the semiconductor wafer W where a temperature drop is likely to occur when the semiconductor wafer W is heated with the light emitted from the halogen heating part 4.

A lamp group of the halogen lamps HL in the upper row and a lamp group of the halogen lamps HL in the lower row are arranged to intersect each other in grids. In other words, the 40 halogen lamps HL are located such that the longitudinal direction of the 20 halogen lamps HL in the upper row and the longitudinal direction of the 20 halogen lamps HL in the lower row are orthogonal to each other.

The halogen lamps HL are filament-type light sources that pass current through a filament disposed in the glass tube to make the filament incandescent, thereby emitting light. Inside the glass tube is filled with a gas prepared by introducing a trace amount of halogen element (e.g., iodine or bromine) into an inert gas such as nitrogen or argon. The introduction of the halogen element allows the temperature of the filament to be set at a high temperature while preventing breakage of the filament. The halogen lamps HL thus have the properties of having a life longer than typical incandescent lamps and being capable of continuously applying intense light. In other words, the halogen lamps HL are continuous lighting lamps that continuously emit light for at least one or more seconds. Moreover, the halogen lamps HL, which are rod-shaped lamps, have a longer life, and disposing the halogen lamps HL in the horizontal direction enhances the efficiency of radiation of the semiconductor wafer W located above the halogen lamps HL.

The halogen heating part 4 includes a reflector 43 provided below the two rows of halogen lamps HL in the casing 41 (FIG. 1). The reflector 43 reflects the light emitted from the plurality of halogen lamps HL toward the heat treatment space 65.

The controller 3 controls the various operating mechanisms of the heat treatment apparatus 1. The hardware configuration of the controller 3 is similar to that of a general-purpose computer. In other words, the controller 3 includes a CPU that is a circuit for performing various types of computations, a ROM that is a read-only memory for storing basic programs, a RAM that is a readable/writable memory for storing various types of information, and a magnetic disk for storing, for example, control software and data. The processing of the heat treatment apparatus 1 is implemented by the CPU of the controller 3 executing predetermined processing programs. As illustrated in FIG. 8, the controller 3 includes the pulse generator 31 and the waveform setting part 32. As described above, the waveform setting part 32 sets a waveform of a pulse signal based on the entry from the input part 33, and the pulse generator 31 outputs a pulse signal to the gate of the IGBT 96 in accordance with the waveform.

The heat treatment apparatus 1 also includes, in addition to the above-mentioned components, various cooling structures in order to prevent an excessive temperature rise of the halogen heating part 4, the flash heating part 5, and the chamber 6 due to heat energy generated by the halogen lamps HL and the flash lamps FL during heat treatment of the semiconductor wafer W. For example, a water-cooled tube (not shown) is provided in the wall of the chamber 6. The halogen heating part 4 and the flash heating part 5 have an air cooling structure that forms a gas flow in its interior to exhaust heat. Also, air is supplied to the clearance between the upper chamber window 63 and the lamp light irradiation window 53 to cool the flash heating part 5 and the upper chamber window 63.

The procedure of treating the semiconductor wafer W by the heat treatment apparatus 1 will now be described. The semiconductor wafer W to be treated here is a semiconductor substrate doped with impurities (ions) by ion implantation. These impurities are activated through heat treatment (annealing) involving the application of flash light by the heat treatment apparatus 1. The procedure of treating by the heat treatment apparatus 1, described below, is implemented by the controller 3 controlling each operating mechanism of the heat treatment apparatus 1.

First, the valve 84 for supplying a gas and the valves 89 and 192 for exhausting a gas are opened to start the supply and exhaust of a gas into and from the chamber 6. When the valve 84 is opened, a nitrogen gas is supplied from the gas supply port 81 to the heat treatment space 65. When the valve 89 is opened, the gas in the chamber 6 is exhausted from the gas exhaust port 86. Consequently, the nitrogen gas supplied from the upper portion of the heat treatment space 65 in the chamber 6 flows downward and is exhausted from the lower portion of the heat treatment space 65.

When the valve 192 is opened, the gas in the chamber 6 is also exhausted from the transport opening 66. Moreover, the atmosphere around the driving part of the transfer mechanism 10 is also discharged by an exhaust mechanism (not shown). During the heat treatment of the semiconductor wafer W in the heat treatment apparatus 1, a nitrogen gas is continuously supplied into the heat treatment space 65, and the amount of supply is appropriately changed in accordance with the treatment step.

Then, the gate valve 185 is opened to open the transport opening 66, and the ion-implanted semiconductor wafer W is transported into the heat treatment space 65 of the chamber 6 through the transport opening 66 by a transport robot located outside the apparatus. The semiconductor wafer W transported by the transport robot is moved directly above the holding part 7 and stopped. The pair of transfer arms 11 of the transfer mechanism 10 then move horizontally from the retraction position to the transfer operation position and moves upward, so that the lift pins 12 pass through the through holes 79 and protrude from the upper surface of the susceptor 74 to receive the semiconductor wafer W.

After the semiconductor wafer W is placed on the lift pins 12, the transport robot retracts from the heat treatment space 65, and the transport opening 66 is closed by the gate valve 185. Then, the pair of transfer arms 11 move down, causing the semiconductor wafer W to be transferred from the transfer mechanism 10 to the susceptor 74 of the holding part 7 and held in a horizontal position from the underside. The semiconductor wafer W is held by the holding part 7 with its impurity-doped surface with a pattern facing upward. The semiconductor wafer W is also held inward of the five guide pins 76 on the upper surface of the susceptor 74. The pair of transfer arms 11 that have moved down to the positions below the susceptor 74 are retracted to the retraction position, that is, to the inside of the recessed portion 62, by the horizontal movement mechanism 13.

After the semiconductor wafer W is held in a horizontal position from the underside by the holding part 7 made of quartz, all of the 40 halogen lamps HL of the halogen heating part 4 are turned on simultaneously to start preheating (assist-heating). The halogen light emitted from the halogen lamps HL passes through the lower chamber window 64 and the susceptor 74 that are made of quartz and is applied from the rear surface (the surface opposite the front surface) of the semiconductor wafer W. The semiconductor wafer W, which has received the light emitted from the halogen lamps HL, is preheated, increasing the temperature of the semiconductor wafer W. Note that the transfer arms 11 of the transfer mechanism 10, which have retracted to the inside of the recessed portion 62, do not impede the heating with the halogen lamps HL.

During preheating with the halogen lamps HL, the temperature of the semiconductor wafer W is measured with the contact-type thermometer 130. Specifically, the contact-type thermometer 130 with a built-in thermocouple is brought into contact with the lower surface of the semiconductor wafer W held by the holding part 7 through the cut-out portion 77 of the susceptor 74 and measures the increasing wafer temperature. The measured temperature of the semiconductor wafer W is transmitted to the controller 3. The controller 3 controls the output of the halogen lamps HL while monitoring whether the temperature of the semiconductor wafer W increasing due to the application of light from the halogen lamps HL has reached a predetermined preheating temperature T1. Specifically, the controller 3 feedback-controls the output of the halogen lamps HL based on the value measured with the contact-type thermometer 130 such that the temperature of the semiconductor wafer W reaches the preheating temperature T1. The preheating temperature T1 is set to approximately 200° C. to 800° C. at which the impurities doped in the semiconductor wafer W will not be diffused by heat, and preferably, may be 350° C. to 600° C. (in the present preferred embodiment, 600° C.). Note that when the temperature of the semiconductor wafer W is increased by the application of light from the halogen lamps HL, the temperature is not measured with the radiation thermometer 120. This is because accurate temperature measurement is difficult due to the halogen light from the halogen lamps HL entering the radiation thermometer 120 as disturbance light.

After the temperature of the semiconductor wafer W reaches the preheating temperature T1, the controller 3 keeps the temperature of the semiconductor wafer W at the preheating temperature T1 for a while. Specifically, when the temperature of the semiconductor wafer W measured with the contact-type thermometer 130 reaches the preheating temperature T1, the controller 3 adjusts the output of the halogen lamps HL to keep the temperature of the semiconductor wafer W at nearly the preheating temperature T1.

The preheating with the halogen lamps HL described above increases the temperatures of the front and rear surfaces of the semiconductor wafer W to the preheating temperature T1. In the preheating stage with the halogen lamps HL, the peripheral portion of the semiconductor wafer W, which is more susceptible to heat radiation, tends to fall below the temperature of the central portion thereof, resulting in an uneven temperature distribution. For this reason, the density at which the halogen lamps HL are arranged in the halogen heating part 4 is higher in the region opposed to the peripheral portion of the semiconductor wafer W than in the region opposed to the central portion thereof (FIG. 7). This arrangement increases the amount of light applied to the peripheral portion of the semiconductor wafer W that is susceptible to heat radiation, thus somewhat alleviating the uneven temperature distribution in the surface of the semiconductor wafer W in the preheating stage with the halogen lamps HL. Such uneven temperature distribution in the surface, however, is difficult to be completely resolved.

When the temperature of the semiconductor wafer W reaches the preheating temperature T1 and then a predetermined time elapses, flash light is applied from the flash lamps FL of the flash heating part 5 to the surface of the semiconductor wafer W, with the remaining uneven temperature distribution in the surface, in which the temperature of the semiconductor wafer W is relatively lower in its peripheral portion than in its central portion. When the flash lamp FL is to apply flash light, the power supply unit 95 causes the capacitor 93 to store electric charge in advance. Subsequently, with the capacitor 93 storing electric charge, the pulse generator 31 of the controller 3 outputs a pulse signal to the IGBT 96 to on-off drive the IGBT 96.

The waveform of a pulse signal can be defined by inputting a recipe, in which the time (on time) of a pulse width and the time (off time) of a pulse interval are sequentially set as parameters, from the input part 33. When the operator inputs such a recipe into the controller 3 from the input part 33, accordingly, the waveform setting part 32 of the controller 3 sets a pulse waveform that is repeatedly turned on and off. Then, the pulse generator 31 outputs a pulse signal in accordance with the pulse waveform set by the waveform setting part 32. Consequently, the gate of the IGBT 96 is applied with a pulse signal having the set waveform, thus controlling on-off driving of the IGBT 96. Specifically, the IGBT 96 turns on when the pulse signal input to the gate of the IGBT 96 is turned on and the IGBT 96 turns off when the pulse signal input thereto is turned off.

The controller 3 controls the trigger circuit 97 to apply a high voltage (trigger voltage) to the trigger electrode 91 in synchronization with the timing at which the pulse signal output from the pulse generator 31 is turned on. With the capacitor 93 storing electric charge, a pulse signal is input to the gate of the IGBT 96, and a high voltage is applied to the trigger electrode 91 in synchronization with the timing at which the pulse signal is turned on. Consequently, a current inevitably flows between the both electrodes of the glass tube 92 when the pulse signal is turned on, thus emitting light by the excitation of xenon atoms or molecules at that time.

In this way, the 30 flash lamps FL of the flash heating part 5 emit light, and accordingly, flash light is applied to the front surface of the semiconductor wafer W held by the holding part 7. When the flash lamp FL is caused to emit light without the use of the IGBT 96, the electric charge stored in the capacitor 93 is consumed by one light emission, and the output waveform from the flash lamp FL is a single pulse with a width of approximately 0.1 to 10 milliseconds. In the present preferred embodiment, contrastingly, the IGBT 96 that is a switching element is connected in the circuit and a pulse signal is output to the gate of the IGBT 96 to interrupt a supply of electric charge from the capacitor 93 to the flash lamp FL by the IGBT 96, thus on-off controlling the current flowing through the flash lamp FL. Consequently, the light emission of the flash lamp FL is "chopper-controlled", and the electric charge stored in the capacitor 93 is consumed in a divided manner, so that the flash lamp FL repeatedly flashes on and off in an extremely short time. Note that before the value of the current flowing through the circuit becomes completely "0", a following pulse is applied to the gate of the IGBT 96 to increase the current value again, and thus, the output of light emission does not become completely "0" also while the flash lamp FL is repeatedly flashing on and off.

As a result, the light emission pattern of the flash lamp FL can be freely defined by the IGBT 96 on-off controlling the current flowing through the flash lamp FL, enabling free adjustment of the light emission time and emission intensity. Specifically, for example, increasing the ratio of the time of a pulse width to the time of a pulse interval, which are input from the input part 33, increases the current flowing through the flash lamp FL, resulting in an increased light emission intensity. Also, increasing the total of the time of a pulse width and the time of a pulse interval, which are input from the input part 33, allows current to flow through the flash lamp FL for a relatively long time, resulting in an increased emission time of the flash lamp FL. Note that the emission time of the flash lamp FL is one second or less at the longest.

The currents flowing through the 30 respective flash lamps FL are controlled individually by the corresponding IGBTs 96. In the present preferred embodiment, the emission time of the flash lamps FL is defined for each zone of the planar array of the 30 flash lamps FL. Specifically, the time for flash light irradiation in the central zone Z1 differs from the time for flash light irradiation in the peripheral zone Z2 in FIG. 9.

Figure 10:
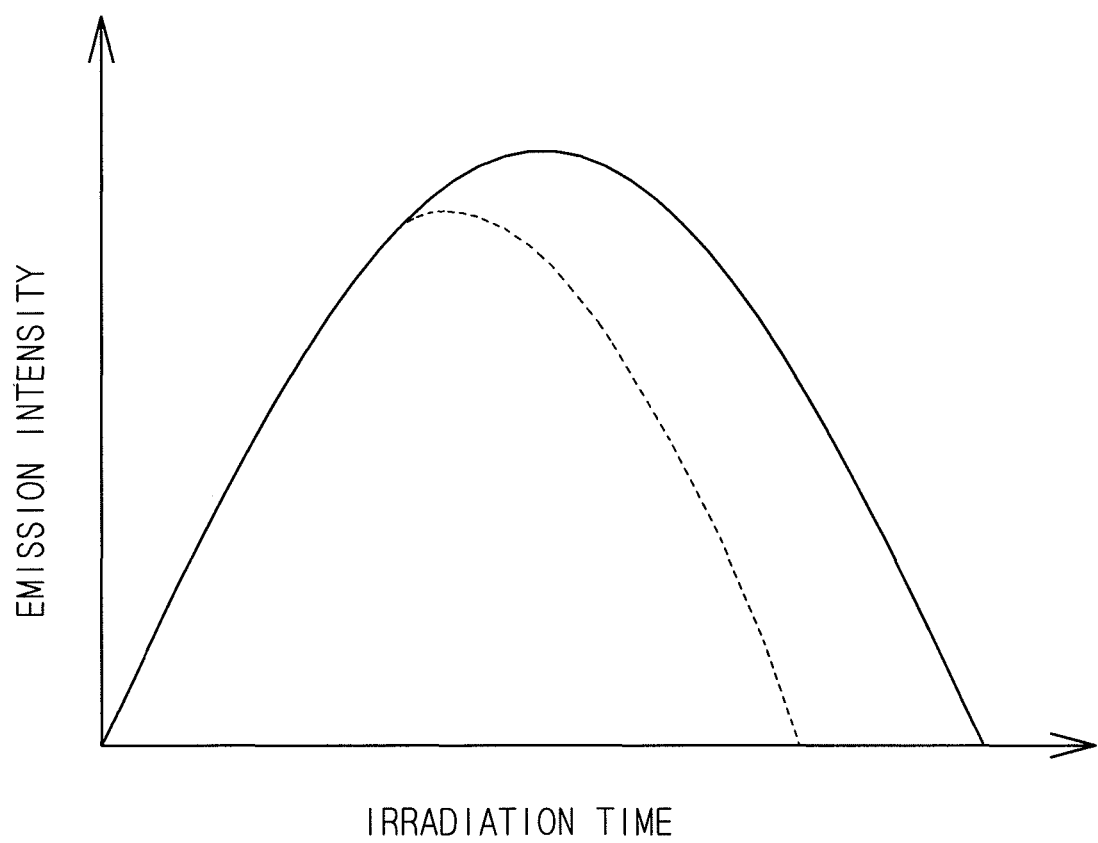
FIG. 10 illustrates the profile of emission intensity of flash lamps according to a first preferred embodiment.

FIG. 10 illustrates the profile of emission intensity of the flash lamps FL according to the first preferred embodiment. In FIG. 10, the vertical axis represents the emission intensity of the flash lamps FL, and the horizontal axis represents the irradiation time since the flash lamps FL start emitting light. In FIG. 10, the solid line represents the profile of emission intensity of the flash lamps FL belonging to the peripheral zone Z2, and the dotted line represents the profile of emission intensity of the flash lamps FL belonging to the central zone Z1.

In the first preferred embodiment, the 8 flash lamps FL belonging to the peripheral zone Z2 and the 22 flash lamps FL belonging to the central zone Z1 start emitting light simultaneously. The emission time of the 8 flash lamps FL belonging to the peripheral zone Z2 is longer than the emission time of the 22 flash lamps FL belonging to the central zone Z1. In other words, in the first preferred embodiment, flash light irradiation in the peripheral zone Z2 and the flash light irradiation in the central zone Z1 are started simultaneously, and the time for the flash light irradiation in the peripheral zone Z2 is longer than the time for the flash light irradiation in the central zone Z1.

Thus, a greater amount of flash light is applied to the peripheral portion of the semiconductor wafer W than to the central portion thereof, resolving an uneven temperature distribution in the surface of the semiconductor wafer W, which has occurred in the preheating stage, in which the temperature is relatively lower in the peripheral portion of the semiconductor wafer W than in the central portion thereof. This results in an equal maximum surface temperature in the flash heating stage between the peripheral portion and the central portion, achieving a uniform temperature distribution in the surface. The degree of the activation of impurities is defined by the maximum surface temperature of the semiconductor wafer W, and even when the temperature distribution in the surface has been uneven in the preheating stage, a uniform degree of the activation of impurities is achieved if the maximum surface temperature of the substrate wafer W finally results in a uniform temperature distribution in the surface thereof in the flash heating stage.

Since the time for flash light irradiation is extremely short, one second or less, even in the peripheral zone Z2, the surface temperature of the semiconductor wafer W subjected to flash heating rises instantly up to a treatment temperature T2 of 1000° C. or higher, and after the activation of the impurities doped into the semiconductor wafer W, the surface temperature drops sharply. The halogen lamps HL continuously apply light before and after the flash lamps FL emit light, and accordingly, the surface temperature of the semiconductor wafer W drops to the preheating temperature T1 or therearound.

After the flash heating process is completed, the halogen lamps HL are also turned off after a predetermined time elapses. As a result, the temperature of the semiconductor wafer W drops sharply from the preheating temperature T1. The temperature of the semiconductor wafer W whose temperature is decreasing is measured with the contact-type thermometer 130 or the radiation thermometer 120, and the measurement result is transmitted to the controller 3. The controller 3 monitors whether the temperature of the semiconductor wafer W has dropped to a predetermined temperature, based on the measurement result. Then, the temperature of the semiconductor wafer W drops to the predetermined temperature or lower, and subsequently, the pair of transfer arms 11 of the transfer mechanism 10 move horizontally from the retraction position to the transfer operation position and move upward, causing the lift pins 12 to protrude from the upper surface of the susceptor 74 and receive the semiconductor wafer W after the heat treatment from the susceptor 74. Subsequently, the transport opening 66 closed by the gate valve 185 is opened, and the semiconductor wafer W placed on the lift pins 12 is transported by the transport robot located outside the apparatus. Then, the process for heating the semiconductor wafer W in the heat treatment apparatus 1 completes.

In the first preferred embodiment, the planar array of the 30 flash lamps FL is divided into the central zone Z1 including the region opposed to the central portion of the semiconductor wafer W and the peripheral zone Z2 outside the central zone Z1. The flash light irradiation in the peripheral zone Z2 and the flash light irradiation in the central zone Z1 are started simultaneously, and the time for the flash light irradiation in the peripheral zone Z2 is longer than the time for the flash light irradiation in the central zone Z1. Thus, a greater amount of flash light is applied to the peripheral portion of the semiconductor wafer W, where a temperature drop is relatively likely to occur during preheating with the halogen lamps HL, than to the central portion thereof, preventing a relative temperature drop in the peripheral portion of the semiconductor wafer W during flash heating. Consequently, the maximum surface temperature results in a uniform temperature distribution in the surface.

In the first preferred embodiment, the flash light irradiation is performed in the peripheral zone Z2 even after the flash light irradiation is completed in the central zone Z1. Thus, the flash light irradiation to the peripheral portion of the substrate wafer W is continuously performed even after the flash light irradiation to the central portion thereof is completed, thus preventing a temperature drop in the central portion associated with the heat transfer to the peripheral portion of the semiconductor wafer W that is susceptible to heat dissipation.

Second Preferred Embodiment

A second preferred embodiment of the present invention will now be described. The configuration of the heat treatment apparatus 1 according to the second preferred embodiment is the same as that of the first preferred embodiment. The procedure of treating the semiconductor wafer W in the heat treatment apparatus 1 according to the second preferred embodiment is also substantially the same as that of the first preferred embodiment. The second preferred embodiment differs from the first preferred embodiment in the light emission pattern in the central zone Z1 and the peripheral zone Z2.

FIG. 11 illustrates the profile of emission intensity of the flash lamps FL in the second preferred embodiment. As in FIG. 10, the solid line represents the profile of emission intensity of the flash lamps FL belonging to the peripheral zone Z2, and the dotted line represents the profile of emission intensity of the flash lamps FL belonging to the central zone Z1.

In the second preferred embodiment, the 22 flash lamps FL belonging to the central zone Z1 start light emission behind the eight flash lamps FL belonging to the peripheral zone Z2. In the second preferred embodiment, the eight flash lamps FL belonging to the peripheral zone Z2 and the 22 flash lamps FL belonging to the central zone Z1 complete light emission simultaneously. As in the first preferred embodiment, thus, the emission time of the eight flash lamps FL belonging to the peripheral zone Z2 is longer than the emission time of the 22 flash lamps FL belonging to the central zone Z1. Specifically, in the second preferred embodiment, the flash light irradiation in the peripheral zone Z2 and the flash light irradiation in the central zone Z1 are completed simultaneously, and the time for the flash light irradiation in the central zone Z2 is longer than the time for the flash light irradiation in the peripheral zone Z1.

As in the first preferred embodiment, thus, a greater amount of flash light is applied to the peripheral portion of the semiconductor wafer W than to the central portion thereof, resolving an uneven temperature distribution in the surface, which has occurred in the preheating stage, in which the temperature is relatively lower in the peripheral portion of the semiconductor wafer W than in the central portion thereof. This results in an equal maximum surface temperature of the semiconductor wafer W between the peripheral portion and the central portion in the flash heating stage, achieving a uniform temperature distribution in the surface. The degree of the activation of impurities is defined by the maximum surface temperature of the semiconductor wafer W, and even when the temperature distribution in the surface has been uneven in the preheating stage, a uniform degree of the activation of impurities is achieved if the maximum surface temperature of the substrate wafer W eventually results in a uniform temperature distribution in the surface thereof in the flash heating stage.

The second preferred embodiment is the same as the first preferred embodiment except for the light emission patterns in the central zone Z1 and the peripheral zone Z2.

In the second preferred embodiment, the planar array of the 30 flash lamps FL is divided into two zones: the central zone Z1 including the region opposed to the central portion of the semiconductor wafer W and the peripheral zone Z2 outside the peripheral zone Z1. The flash light irradiation in the peripheral zone Z2 and the flash light irradiation in the central zone Z1 are completed simultaneously, and the time for the flash light irradiation in the peripheral zone Z2 is longer than the time for the flash light irradiation in the central zone Z1. Thus, a greater amount of flash light is applied to the peripheral portion of the semiconductor wafer W, where a temperature drop is relatively likely to occur during preheating with the halogen lamps HL, than to the central portion thereof, preventing a relative temperature drop in the peripheral portion of the semiconductor wafer W during flash heating. Consequently, the maximum surface temperature results in a uniform temperature distribution in the surface.

In the second preferred embodiment, the flash light irradiation in the peripheral zone Z2 and the flash light irradiation in the central zone Z1 are completed simultaneously, and thus, the temperature of the semiconductor wafer W drops entirely at a uniform cooling rate.

Variations

While the preferred embodiments of the present invention have been described above, various modifications other than the examples described above can be made without departing from the scope of the invention. For example, while the flash light irradiation in the peripheral zone Z2 and the flash light irradiation in the central zone Z1 are started simultaneously in the first preferred embodiment and the flash light irradiation in the peripheral zone Z2 and the flash light irradiation in the central zone Z1 are completed simultaneously in the second preferred embodiment, the irradiation timing may be any other timing in both of the zones.

For example, the flash light irradiation in the peripheral zone Z2 may be started before and completed after the flash light irradiation in the central zone Z1. Alternatively, the flash light irradiation in the peripheral zone Z2 may be started and completed before the flash light irradiation in the central zone Z1. Contrastingly, the flash light irradiation in the peripheral zone Z2 may be started and completed after the flash light irradiation in the central zone Z1. In any of the patterns, if the time for the flash light irradiation in the peripheral zone Z2 is longer than the time for the flash light irradiation in the central zone Z1, a greater amount of flash light is applied to the peripheral portion of the semiconductor wafer W, where a temperature drop is relatively likely to occur during preheating, than to the central portion thereof. This prevents a relative temperature drop in the peripheral portion of the semiconductor wafer W during flash heating. Preferably, the flash light irradiation duration in the central zone Z1 and the flash light irradiation duration in the peripheral zone Z2 partially overlap each other.

In addition to setting the time for the flash light irradiation in the peripheral zone Z2 to be longer than the time for the flash light irradiation in the central zone Z1, the charge voltages across the capacitors 93 that supply electric charge to the eight flash lamps FL belonging to the peripheral zone Z2 may be set to be higher than the charge voltages across the capacitors 93 that supply electric charge to the 22 flash lamps FL belonging to the central zone Z1. Consequently, the discharge voltages of the eight flash lamps FL belonging to the peripheral zone Z2 are higher than the discharge voltages of the 22 flash lamps FL belonging to the central zone Z1 during flash light irradiation, further increasing the intensity of the flash light applied to the peripheral portion of the semiconductor wafer W compared with the intensity of the flash light applied to the central portion thereof. This more reliably prevents a relative temperature drop in the peripheral portion of the semiconductor wafer W during flash heating.

While the flash heating part 5 includes 30 flash lamps FL in the preferred embodiments above, alternatively, the flash heating part 5 may include any number of flash lamps FL. The numbers of the flash lamps FL belonging to the central zone Z1 and the flash lamps FL belonging to the peripheral zone Z2 are not limited respectively to 22 and 8, which may be any numbers.

The flash lamps FL are not limited to xenon flash lamps and may be krypton flash lamps. The number of the halogen lamps HL included in the halogen heating part 4 is not limited to 40, and the halogen heating part 4 may include any number of halogen lamps HL as long as each of the upper and lower rows includes the array of a plurality of halogen lamps.

Also, substrates to be treated by the heat treatment apparatus according to the present invention are not limited to semiconductor wafers, and may be glass substrates for use in a flat display panel such as a liquid crystal display device or substrates for solar cells. The technique according to the present invention is also applicable to heat treatment of a high dielectric gate film (high-k film), bonding of metal and silicon, and crystallization of polysilicon.

While the invention has been described in detail, the foregoing description is in all aspects illustrative and not preventive. It is therefore understood that numerous modifications and variations can be devised without departing from the scope of the invention.

What is claimed is:

1. A heat treatment method for irradiating a substrate with flash light from an array of a plurality of flash lamps arranged in a plane to heat said substrate, said method comprising:

(a) irradiating said substrate with light from a halogen lamp to perform preheating; and (b) irradiating said substrate with flash light from said plurality of flash lamps, wherein in said step (b), a time for flash light irradiation in a second zone of said array of said plurality of flash lamps is longer than a time for flash light irradiation in a first zone thereof, said first zone including a region opposed to a central portion of said substrate held in a chamber, said second zone being located outside said first zone, wherein a discharge voltage of a flash lamp belonging to said second zone is higher than a discharge voltage of a flash lamp belonging to said first zone, and wherein an intensity of flash light from said second zone is higher than an intensity of flash light from said first zone, wherein the flash light irradiation in said first zone and the flash light irradiation in said second zone are started simultaneously, and wherein the flash light irradiation in said second zone is completed later than the flash light irradiation in said first zone, wherein uneven temperature distribution in the surface, in which a temperature of the peripheral portion of said substrate is lower than that of the central portion thereof occurs in said step (a), and in said step (b) a maximum surface temperature in said central portion and a maximum surface temperature in said peripheral portion are made to be equal to eliminate said uneven temperature distribution and thereby achieve uniform temperature distribution in said substrate.

2. The heat treatment method according to claim 1, wherein the time for the flash light irradiation in said first zone and the time for the flash light irradiation in said second zone are defined by on-off controlling currents individually flowing through each of said plurality of flash lamps by an insulated gate bipolar transistor.

* * * * *